(12) United States Patent
Li (10) Patent No.: US 10,734,414 B2
(45) Date of Patent: Aug. 4, 2020

(54) ARRAY SUBSTRATE AND DISPLAY APPARATUS USING SAME

(71) Applicants: HKC Corporation Limited, Shenzhen, Guangdong (CN); Chongqing HKC Optoelectronics Technology Co., Ltd., Chongqing (CN)

(72) Inventor: Zeyao Li, Chongqing (CN)

(73) Assignee: HKC Corporation Limited, Shenzhen, Guangdong (CN)

( * ) Notice: Subject to any disclaimer, the term of this patent is extended or adjusted under 35 U.S.C. 154(b) by 299 days.

(21) Appl. No.: 15/745,519

(22) PCT Filed: Dec. 19, 2017

(86) PCT No.: PCT/CN2017/117077
§ 371 (c)(1),
(2) Date: Jan. 17, 2018

(87) PCT Pub. No.: WO2019/071813
PCT Pub. Date: Apr. 18, 2019

(65) Prior Publication Data
US 2020/0083255 A1    Mar. 12, 2020

(30) Foreign Application Priority Data

Oct. 12, 2017  (CN) .......................... 2017 1 0947398

(51) Int. Cl.
*H01L 27/12* (2006.01)
*H01L 29/786* (2006.01)
(Continued)

(52) U.S. Cl.
CPC ...... *H01L 27/124* (2013.01); *H01L 29/78633* (2013.01); *G02F 1/133512* (2013.01);
(Continued)

(58) Field of Classification Search
CPC .......................... G02F 1/136286; H01L 27/124
See application file for complete search history.

(56) References Cited

U.S. PATENT DOCUMENTS

2012/0033169 A1\* 2/2012 Lee ................... G02F 1/133512
349/139
2012/0112200 A1\* 5/2012 Nagano ............. G02F 1/134363
257/72
(Continued)

FOREIGN PATENT DOCUMENTS

CN    103187422 S   7/2013
CN    103926768 A   7/2014
(Continued)

OTHER PUBLICATIONS

International Search Report dated Jul. 20, 2018, in the corresponding PCT application PCT/CN2017/117077, 8 pages in Chinese, 2 pages in English.

*Primary Examiner* — Alexander P Gross
(74) *Attorney, Agent, or Firm* — Juan Carlos A. Marquez; Marquez IP Law Office, PLLC (57) ABSTRACT

This application relates to an array substrate and a display apparatus using same. A structure of the array substrate includes: a substrate; a plurality of scanning lines arranged in parallel in a second direction on the substrate; a plurality of data lines arranged in parallel in the first direction on the substrate; a plurality of pixel cells; a mesh common electrode line, where the mesh common electrode line includes a plurality of first common electrode lines and a plurality of second common electrode lines; and a plurality of metal shield layers disposed between the data line and the subpixel, where the plurality of data lines extends along a first broken-line route in the first direction and the second direction and includes at least one step-shape appearance.

20 Claims, 11 Drawing Sheets

(51) Int. Cl.
*G02F 1/1335* (2006.01)
*G02F 1/1362* (2006.01)
*G09G 3/36* (2006.01)

(52) U.S. Cl.
CPC ............ *G02F 2001/136218* (2013.01); *G02F 2201/40* (2013.01); *G09G 3/3614* (2013.01); *G09G 2300/0426* (2013.01); *G09G 2300/0465* (2013.01); *G09G 2320/0209* (2013.01)

(56) References Cited

U.S. PATENT DOCUMENTS

2016/0117965 A1* 4/2016 Lee .................. G02F 1/136286
 345/209
2017/0235200 A1* 8/2017 Chong .............. G02F 1/134309
 257/59

FOREIGN PATENT DOCUMENTS

| CN | 105182582 A | 12/2015 |
| CN | 105549259 A | 5/2016 |
| WO | 2010070735 A1 | 6/2010 |

* cited by examiner

ARRAY SUBSTRATE AND DISPLAY APPARATUS USING SAME

BACKGROUND

Technical Field

This application relates to an array substrate and a display apparatus using same, and in particular, to an array substrate in which an arrangement manner of pixels is changed and a display apparatus using same.

Related Art

Two neighboring sub-pixels in a half source driving (Half Source Driving, HSD) pixel array share one data line. In a first pixel cell row, the first sub-pixel and the second sub-pixel share one data line, and the third sub-pixel and the fourth sub-pixel share another data line. In this way, a quantity of data lines is half of a quantity of data lines in a conventional drive pixel array, and not every two pixels in a same pixel cell row share one data line, so that data lines in an entire panel are prevented from being unevenly arranged.

To avoid uneven distribution of common electrode voltages of a display in an HSD pixel array of a large-sized panel, a mesh common electrode line (Mesh Com) is arranged in the entire panel. Further, to prevent inversion of a single pixel at an opening boundary area from being affected by a fringing electric field of a data line, metal shield layers (Shielding Metal) are added.

Due to that the quantity of data lines is reduced to half and that the common electrode line and the metal shield layers are further designed, line widths of metal lines between every two sub-pixels in a horizontal direction are different. Consequently, when designing a black matrix (BM) of a color filter, widths of the BM in the horizontal direction are different, and larger widths of the BM are on a same column and smaller widths of the BM are on a same column. This leads to that when using a display with eyes, when there is a specific relationship between an observation distance and a width of a BM, obvious mura (Muga) appears in the display.

SUMMARY

To resolve the foregoing technical problem, an objective of this application is to provide a pixel arrangement manner in a display, and in particular, relates to a pixel arrangement manner that can improve mura in a display, so as to resolve a problem that mura is generated in many current HSD displays, and to improve user experience.

To resolve the technical problem, an array substrate in which an arrangement manner of pixels is changed is used in this application. Widths of an upper layer light shield area are evenly distributed by changing distances between sub-pixels, so that mura in a display is improved, and a problem such as mura is resolved.

The objective of this application may be achieved and the technical problem of this application may be resolved by using the following technical solutions.

This application provides an array substrate, comprising: a substrate; wherein active switches are disposed on the substrate; a plurality of scanning lines extending in a first direction and arranged in parallel in a second direction on the substrate; a plurality of data lines arranged in parallel in the first direction on the substrate; a plurality of pixel cells, wherein each pixel cell is defined by crossing of two neighboring scanning lines and two neighboring data lines, and each pixel cell comprises two sub-pixels; a mesh common electrode line, comprising a plurality of first common electrode lines respectively in parallel with some or all of the plurality of data lines and a plurality of second common electrode lines respectively in parallel with the plurality of scanning lines; and a plurality of metal shield layers, wherein each metal shield layer extends in the second direction and is disposed between the data line and the sub-pixel, wherein the plurality of data lines extends along a first broken-line route in the first direction and the second direction and comprises at least one step-shape appearance, and the plurality of first common electrode lines and the plurality of data lines are interlaced on the substrate in the first direction and along a first broken-line route the same as the first broken-line route or a second broken-line route that is the reverse of the first broken-line route. The first direction is a horizontal direction, and the second direction is a vertical direction.

In an embodiment of this application, the second common electrode line is disposed between neighboring scanning lines.

In an embodiment of this application, a light shield layer covering areas among all sub-pixels is further comprised.

In an embodiment of this application, the light shield layer is a black matrix.

In the foregoing embodiment of this application, the light shield layer covers the scanning line, the data line, and the first common electrode line.

In the foregoing embodiment of this application, the light shield layer comprises a plurality of first and second light shield areas, wherein the first light shield area is above the data line and the metal shield layer in the second direction, and the second light shield area is above the first common electrode line in the second direction. In addition, a width of the first light shield area is greater than a width of the second light shield area.

In the foregoing embodiment of this application, the first light shield area and the second light shield area are interlaced.

Further, the objective of this application may be achieved and the technical problem of this application may be resolved by using the following technical solutions.

This application provides a display apparatus, comprising a control component and a display panel comprising any foregoing array substrate. The control component may be a backlight module. The backlight module may be a straight-down type backlight module or a side-light type backlight module.

After being improved by means of this application, different widths of a light shield layer and between sub-pixels are evenly distributed on a display panel, thereby improving mura in a display and effectively resolving the display problem of the foregoing apparatus. Further, this application also has a function of improving various mura phenomenon caused by uneven distribution of lightness in a display.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the description are considered to be essentially exemplary, rather than limitative. In the figures, units with similar structures are represented by using the same reference number. In addition, for understanding and ease of description, the size and the width of each component shown in the accompanying drawings are arbitrarily shown, but this application is not limited thereto.

In the accompanying drawings, for clarity, widths of a pixel, a scanning line, a data line, a common electrode line, and the like are enlarged. It should be understood that when a component such as a pixel, a scanning line, a data line, or a substrate is described to be "on" "another component", the component may be directly on the another component, or there may be an intermediate component.

In addition, in this specification, unless otherwise explicitly described to have an opposite meaning, the term "include" is understood as including the component, but not excluding any other component. In addition, in this specification, "on" means that one is located above or below a target component and does not necessarily mean that one is located on the top based on a gravity direction.

To further describe the technical means adopted in this application to achieve the intended application objective and effects thereof, specific implementations, structures, features, and effects of an array substrate and a display apparatus using same provided according to this application are described below in detail with reference to the drawings and preferred embodiments.

Figure 1A:
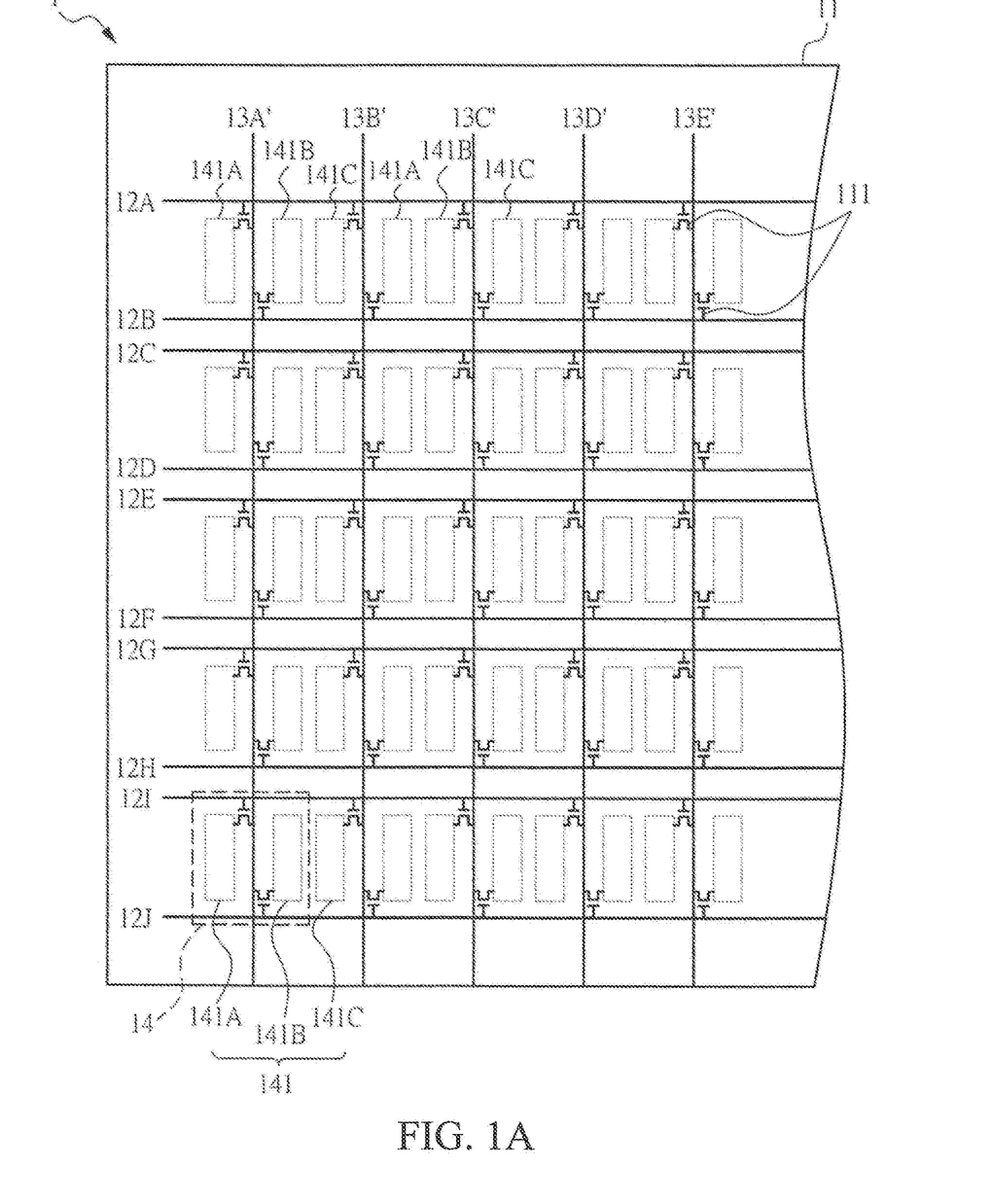
FIG. 1A is a schematic diagram of pixel cell arrangement in an exemplary array substrate.

For a structure of an exemplary array substrate, refer to FIG. 1A to FIG. 1D first. As shown in FIG. 1A, the exemplary array substrate 1' includes a substrate 11 on which a plurality of active switches 111 is disposed. A plurality of scanning lines is arranged in parallel in a first direction (which is a horizontal direction in this embodiment) on the substrate, including a scanning line 12A, a scanning line 12B, a scanning line 12C, a scanning line 12D, a scanning line 12E, . . . . A plurality of data lines is arranged in parallel in a second direction (which is a vertical direction in this embodiment) on the substrate, including a data line 13A', a data line 13B', a data line 13C', a data line 13D', a data line 13E', . . . . The scanning lines and the data lines are crossed on the substrate 11 and form a plurality of pixel cells 14. Each pixel cell 14 includes two sub-pixels, for example, RGB sub-pixels (a red sub-pixel 141A, a green sub-pixel 141B, and a blue sub-pixel 141C). The two sub-pixels are sequentially arranged in the pixel cell 14 in a form of an array. That is, in the technology of the exemplary array substrate 1', two neighboring sub-pixels 141 in a pixel array share one data line. The first sub-pixel (for example, the red sub-pixel 141A) and the second sub-pixel (for example, the green sub-pixel 141B) in a first pixel cell row share one data line (for example, the data line 13A'), and the third sub-pixel (for example, the blue sub-pixel 141C) and the fourth sub-pixel (for example, the red sub-pixel 141A) share another data line (for example, the data line 13B'). In this way, a quantity of data lines is half of a quantity of data lines in a conventional drive pixel array, and not every two sub-pixels 141 in a same pixel cell row share one data line, so that data lines in an entire panel arc prevented from being unevenly arranged.

Figure 1B:
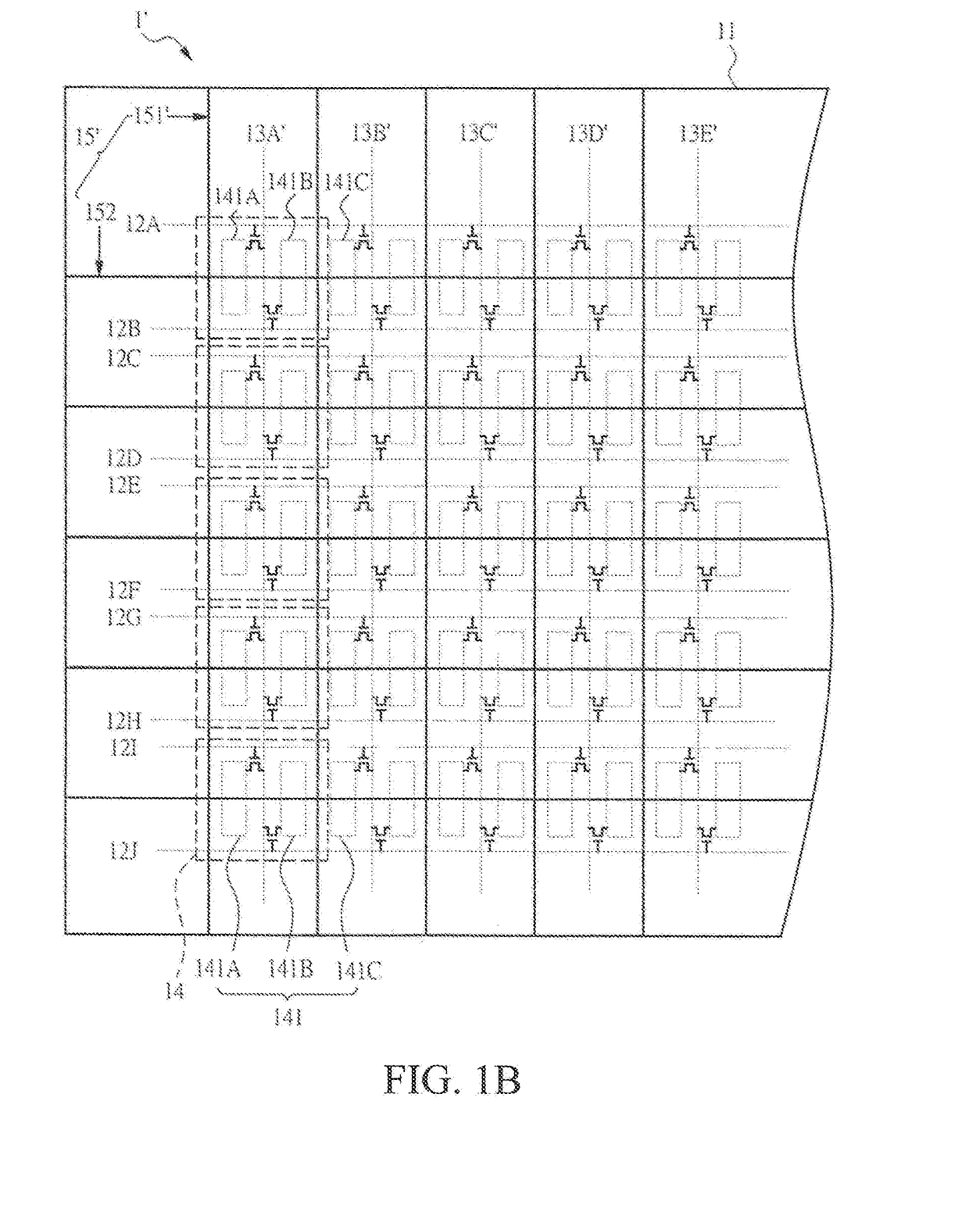
FIG. 1B is a schematic diagram of mesh common electrode line arrangement in an exemplary array substrate.
Figure 1C:
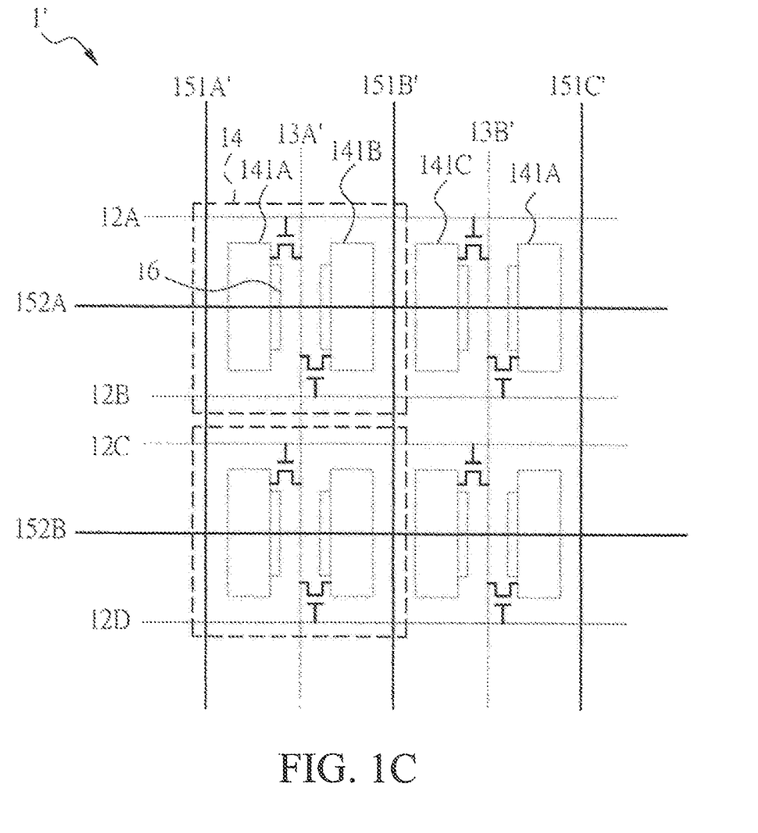
FIG. 1C is an enlarged schematic diagram of metal shield layer disposing in an exemplary array substrate.

Further, referring to FIG. 1B, to avoid uneven distribution of common electrode voltages of a display in a pixel array of a large-sized panel, a mesh common electrode line 15' (including a first common electrode line 151' and a second common electrode line 152) is arranged in the entire panel. Further, to prevent inversion of a single sub-pixel 141 from being affected by a fringing electric field of a data line, metal shield layers 16 shown in FIG. 1C are added.

Figure 1D:
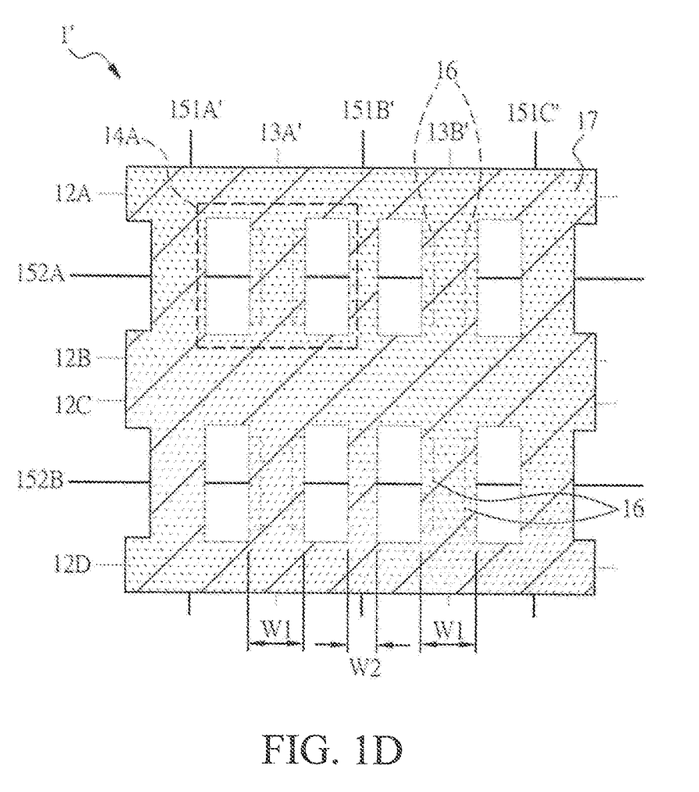
FIG. 1D is a schematic diagram of light shield layer distribution in an exemplary array substrate.

However, due to that the quantity of data lines is reduced to half and that the mesh common electrode line 15' and the metal shield layers 16 are further designed, line widths of metal lines between every two sub-pixels 141 in a horizontal direction are different, as shown in FIG. 1D. Consequently, when designing a light shield layer 17 (a black matrix, BM), widths of the light shield layer 17 in the horizontal direction are different, and widths W1 in the horizontal direction and of the light shield layer 17 above the data line 13A' and the data line 13B' in the first pixel cell row are greater than widths of the light shield layer above a first common electrode line 151A', a first common electrode line 151B', and a first common electrode line 151C'. It can be learned from FIG. 1A to FIG. 1D that larger widths W1 of the light shield layer 17 are on a same column (for example, a first light shield layer 171) and smaller widths W2 of the light shield layer 17 are on a same column (for example, a second light shield layer 172). Consequently, when using a display with eyes, when there is a specific relationship between an observation distance and a width of a light shield layer, obvious mura appears in the display.

Figure 2A:
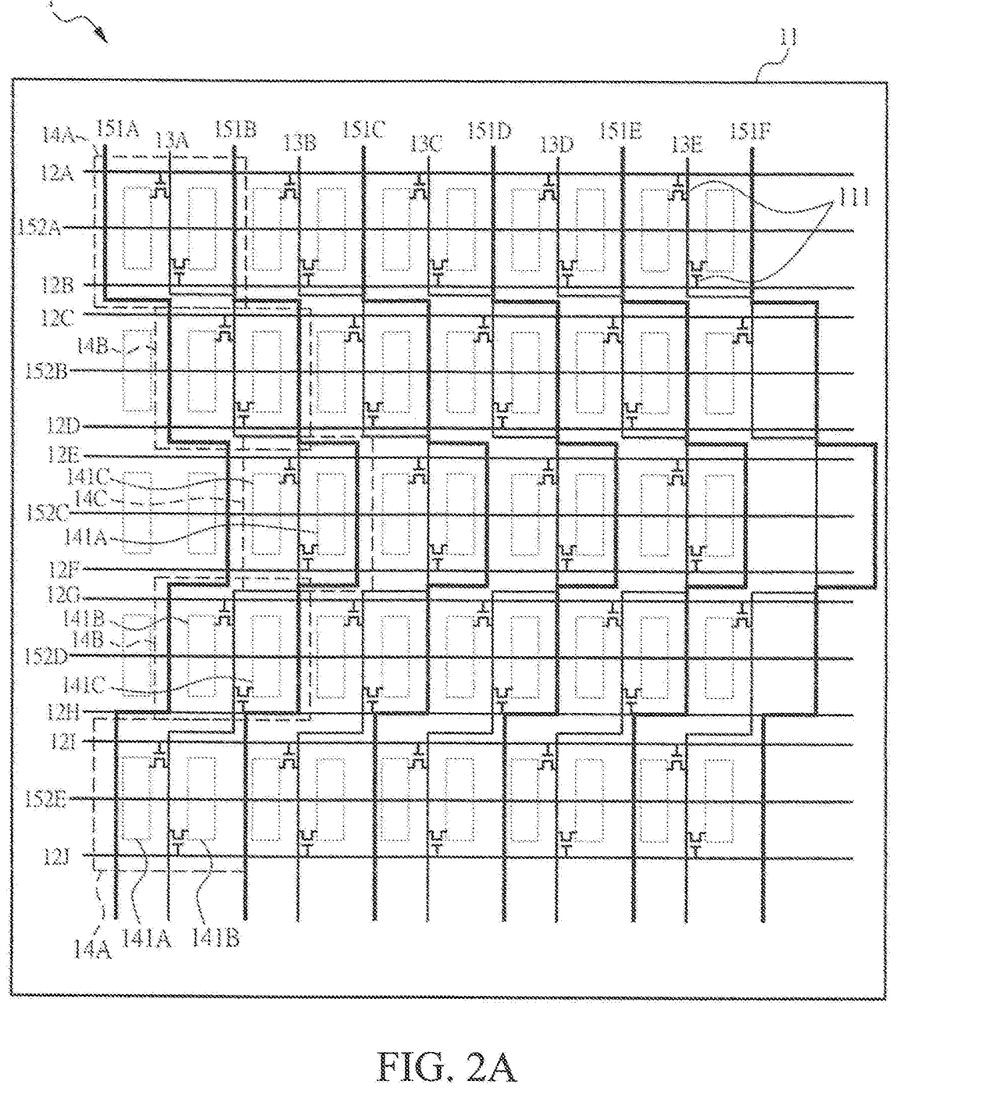
FIG. 2A is a schematic diagram of mesh common electrode line arrangement according to an embodiment of this application.

Therefore, as shown in FIG. 2A to FIG. 2C and FIG. 3A to FIG. 3C, this application provides an array substrate 1, including: a substrate 11; where a plurality of active switches 111 is disposed on the substrate 11; a plurality of scanning lines, such as a scanning line 12A, a scanning line 12B, a scanning line 12C, a scanning line 12D, a scanning line 12E, . . . , extending in a first direction (which is a horizontal direction in this embodiment) and is arranged in parallel in a second direction (which is a vertical direction in this embodiment) on the substrate 11; a plurality of data lines, such as a data line 13A, a data line 13B, a data line 13C, a data line 13D, a data line 13E, . . . , arranged in parallel in the horizontal direction on the substrate 11; a plurality of pixel cells 14, where each pixel cell 14 is defined by crossing two neighboring scanning lines and two neighboring data lines, and each pixel cell 14 includes two sub-pixels 141 (such as red sub-pixels 141A, green sub-pixels 141B, and blue sub-pixels 141C); a mesh common electrode line 15, where the mesh common electrode line 15 includes a plurality of first common electrode lines 151A, 151B, 151C, . . . respectively in parallel with some or all of the plurality of data lines and a plurality of second common electrode lines 152A, 152B, 152C, . . . respectively in parallel with the plurality of scanning lines; and a plurality of metal shield layers 16, where each metal shield layer 16 extends in the vertical direction and is disposed between the data line, such as the data line 13A, the data line 13B, the data line 13C, the data line 13D, the data line 13E, . . . and the sub-pixel 141, where the plurality of data line extends along a first broken-line route and in the first direction and the second direction (which are the vertical direction and the horizontal direction in this embodiment) and includes at least one step-shape appearance. As shown in the embodiment of FIG. 2A, the plurality of first common electrode lines 151A, 151B, . . . and the plurality of data lines are interlaced on the substrate 11 in the horizontal direction and along a first broken-line route the same as the first broken-line route.

Pixel cells 14 in a first pixel cell row in FIG. 1A are neatly arranged, and all of the pixel cells 14 include same sub-pixels. For example, each pixel cell in FIG. 1A includes a red sub-pixel 141A and a green sub-pixel 141B. However, pixel cells 14A, 14B, and 14C in a first pixel cell row in FIG. 2A are arranged in a step shape. As shown in FIG. 2A, a pixel cell 14A includes a red sub-pixel 141A and a green sub-pixel 141B; a pixel cell 14B includes a green sub-pixel 141B and a blue sub-pixel 141C; a pixel cell 14C includes a sub-pixel 141C and a red sub-pixel 141A. Compared with the first cell row in the exemplary array substrate 1' in FIG. 1A and in which pixel cells are neatly arranged (where each pixel cell 14 includes a red sub-pixel 141A and a green sub-pixel 141B), the first cell row in this application is formed by repeatedly arranging the pixel cells 14A, 14B, and 14C in a step-shape.

Figure 2B:
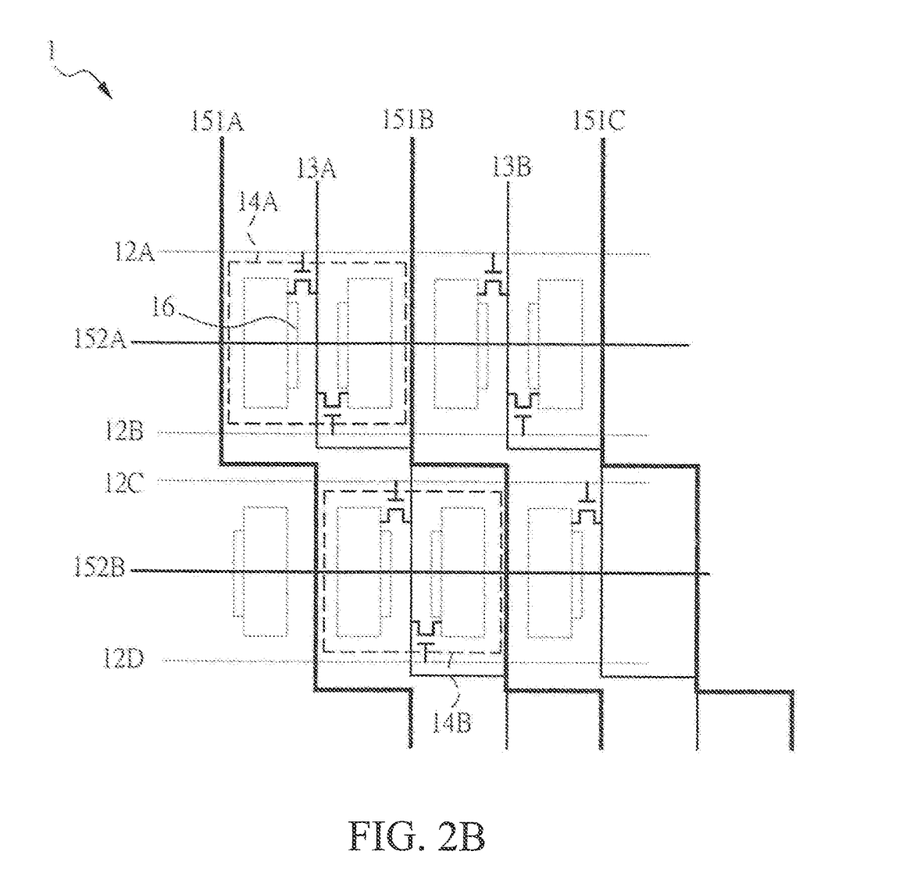
FIG. 2B is an enlarged schematic diagram of metal shield layer disposing according, to an embodiment of this application.
Figure 2C:
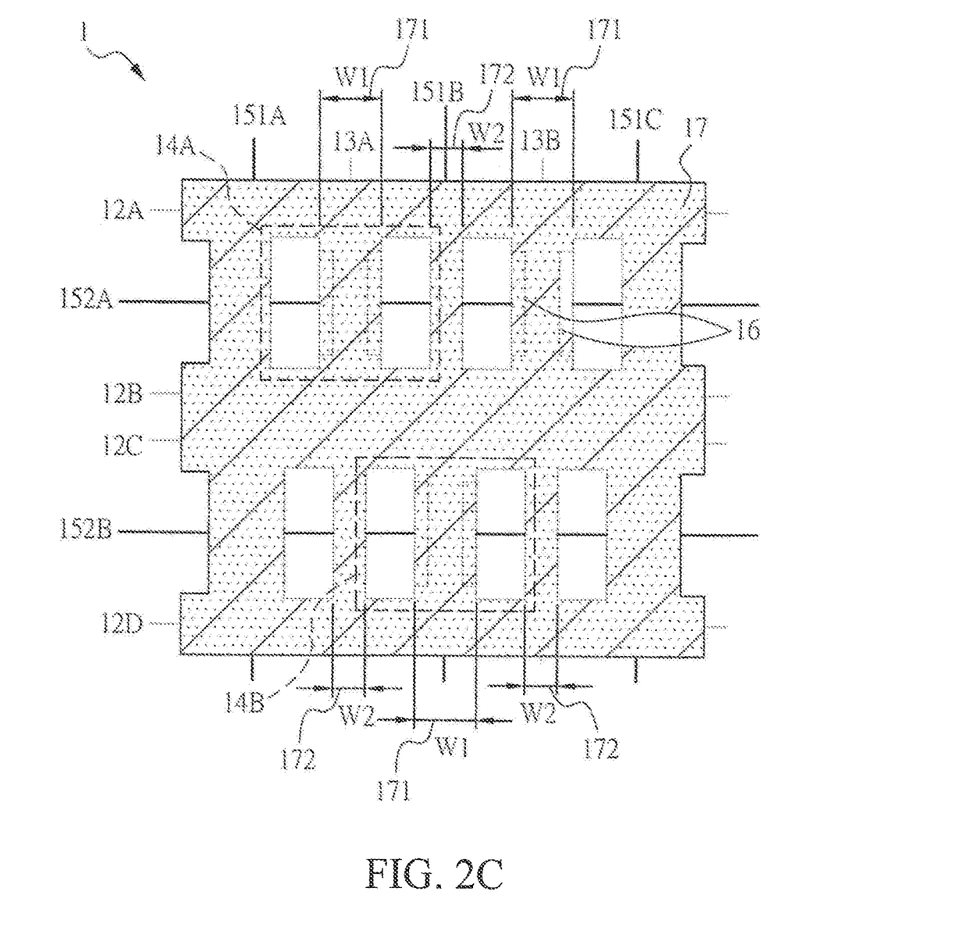
FIG. 2C is a schematic diagram of light shield layer distribution according to an embodiment of this application.

Therefore, as shown in FIG. 2B and FIG. 2C, in this application, a distance between the sub-pixels 141 is relatively long due to that the metal shield layers 16 are disposed between the sub-pixels 141 and the data lines, while a distance between each sub-pixel 141 and the first common electrode lines 151A, 151B, or 151C is relatively short. The metal shield layers 16 are staggered in the vertical direction. Therefore, in the light shield layer 17, a first light shield area 171 above the data lines 13A, 1313, 13C, . . . and the metal shield layers 16 in the vertical direction and having a relatively large width W1 and a second light shield area 172 above the first common electrode lines 151A, 151B, 151C, . . . in the vertical direction and having a relatively small width W2 are interlaced and not continuous. In this way, different widths of the light shield layer are evenly distributed on the panel, reducing a probability of generation of mura.

In this embodiment, the second common electrode lines 152A, 152B, 152C, . . . are disposed between neighboring scanning lines (for example, between the scanning line 12A and the scanning line 12B).

In an embodiment, a light shield layer 17 for covering areas among all sub-pixels 141 is further included.

In an embodiment, the light shield layer 17 is a black matrix.

In an embodiment, the light shield layer 17 is used for covering the scanning lines 12A, 12B, the data lines 13A, 13B, . . . , and the first common electrode lines 151A, 151B, . . . .

In an embodiment, the light shield layer 17 includes a plurality of first light shield areas 171 and second light shield areas 172. The first light shield area 171 is above the data lines 13A, 13B, . . . and the metal shield layers 16 in a vertical direction, and the second light shield area 172 is above the first common electrode lines 151A, 151B, . . . in the vertical direction, and a width W1 of the first light shield area 171 is greater than a width W2 of the second light shield area 172.

In an embodiment, the first light shield, area 171 and the second light shield area 172 are interlaced.

In this application, the first common electrode lines 151A, 151B, . . . and the plurality of data lines are interlaced on the substrate 11 in a horizontal direction and along a first broken line route the same as the first broken-line route or a second broken-line route that is the reverse of the first broken-line route. Differences between the embodiments of FIG. 3A to FIG. 3C and the embodiments of FIG. 2A to FIG. 2C lie in that, in the embodiments of FIG. 2A to FIG. 2C, the first common electrode lines 151A, 151B, 151C, . . . and the plurality of data lines 13A, 13B, 13C, . . . are interlaced on the substrate 11 in a horizontal direction and along a first broken-line route the same as the first broken-line route, and in the embodiments of FIG. 3A to FIG. 3C, the first common electrode lines 151A, 151B, 151C, . . . and the plurality of data lines are interlaced on the substrate 11 in a horizontal direction and along the second broken-line route that is the reverse of the first broken-line route, as shown in FIG. 3A.

Figure 3A:
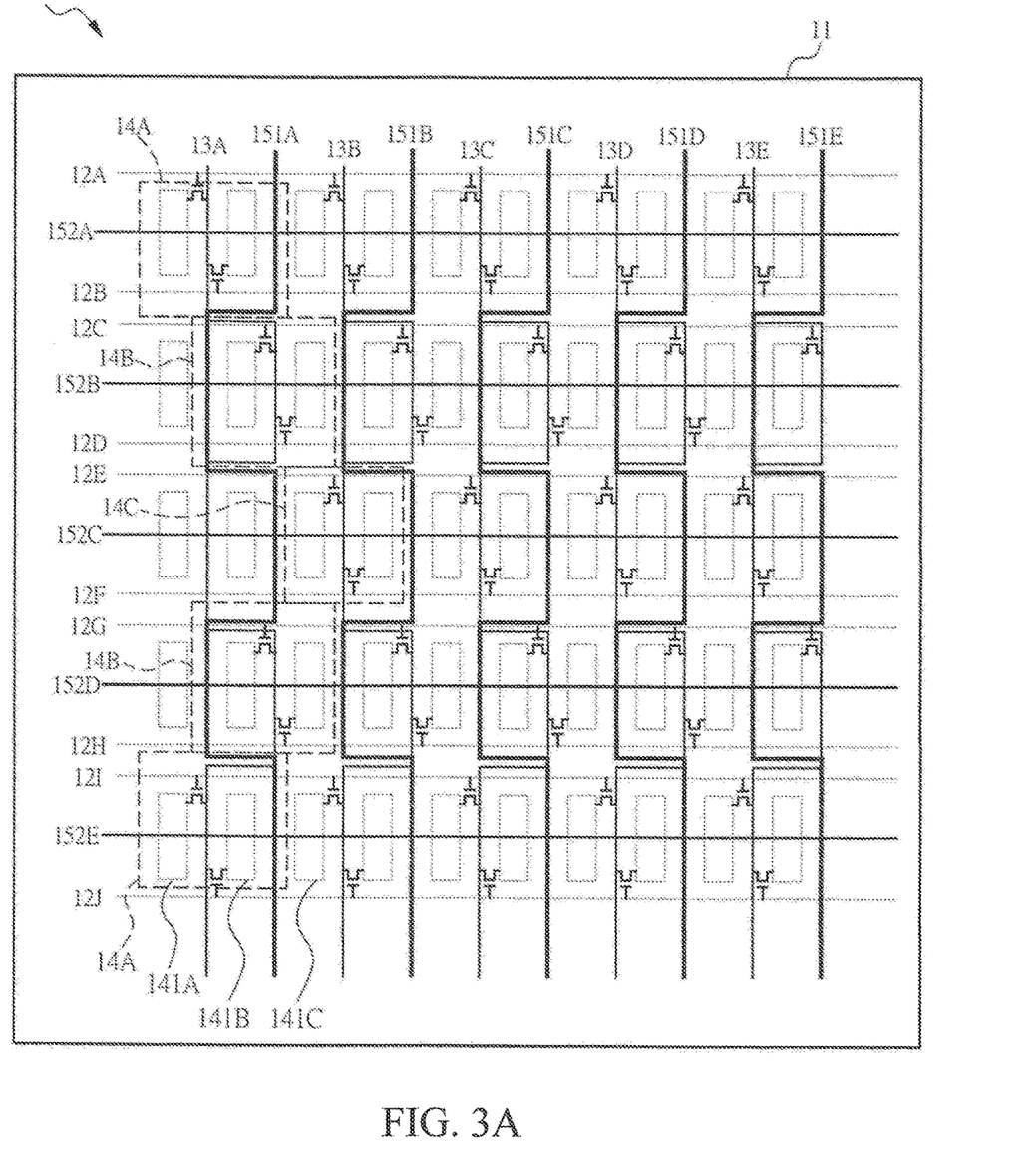
FIG. 3A is a schematic diagram of mesh common electrode line arrangement according to another embodiment of this application.
Figure 3B:
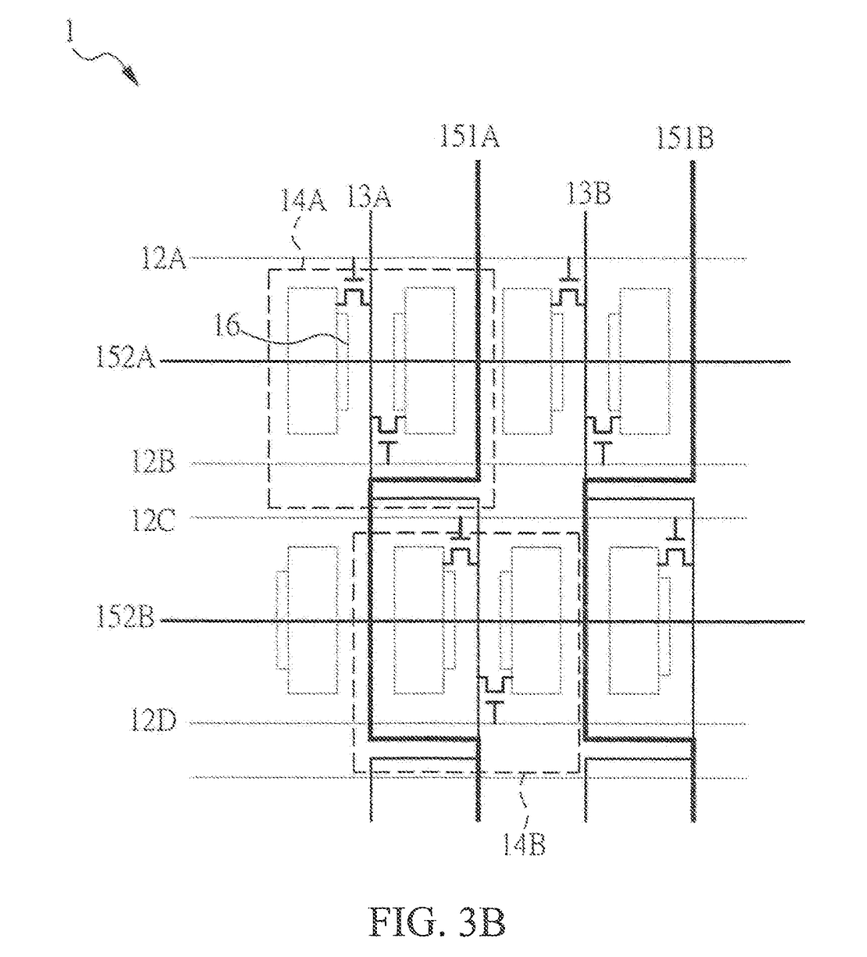
FIG. 3B is an enlarged schematic diagram of metal shield layer disposing according to another embodiment of this application.
Figure 3C:
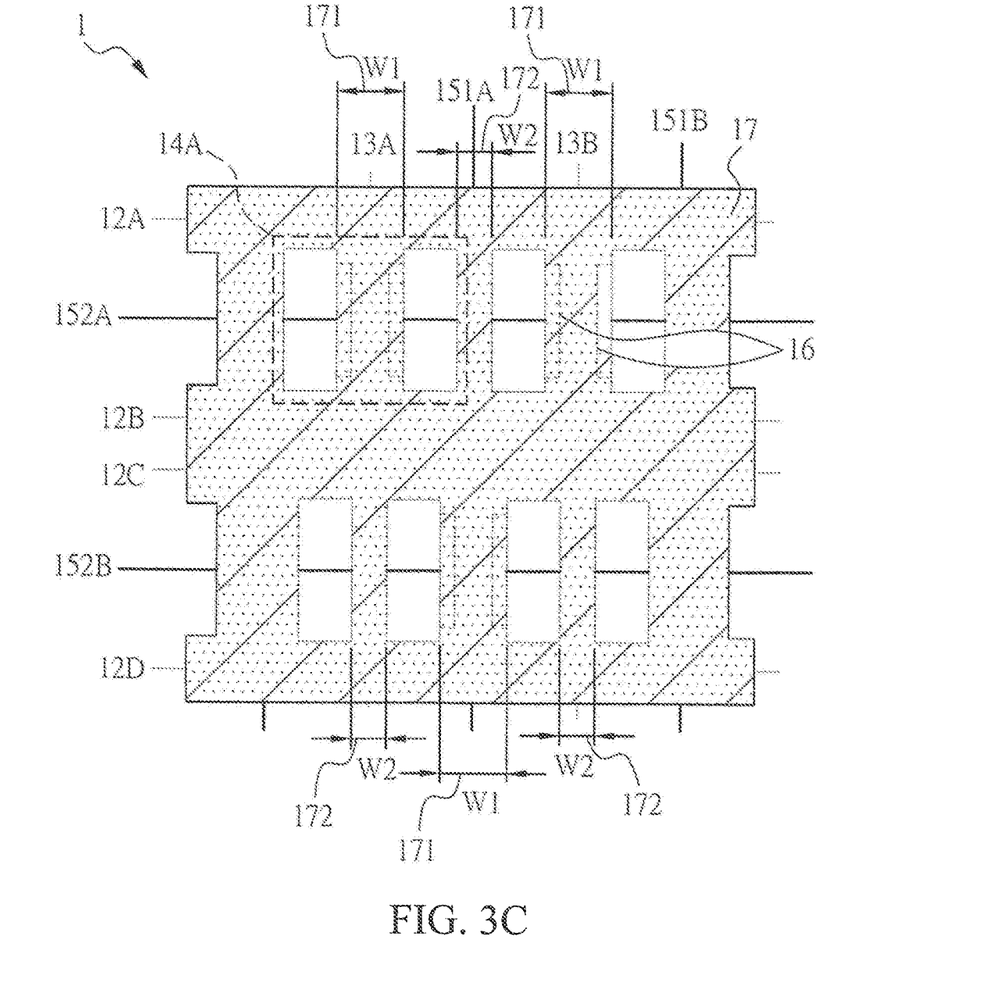
FIG. 3C is a schematic, diagram of light shield layer distribution according to another embodiment of this application.

The first common electrode lines 151A, 151B, 151C, . . . and the data lines 13A, 13B, 13C, . . . shown in FIG. 3A interlaced also can stagger the metal shield layers 16, so that in the light shield layer 17, the first light shield area 171 above the data lines 13A, 13B, 13C, . . . and the metal shield layers 16 in the vertical direction and having a relatively large width W1 and the second light shield areas 172 above the first common electrode lines 151A, 151B, 151C, . . . in the vertical direction and having a relatively small width W2 are interlaced and not continuous. In this way, different widths of the light shield layer are evenly distributed on the panel, as shown in FIG. 3B and FIG. 3C.

Further, the objective of this application may be achieved and the technical problem of this application may be resolved by using the following technical solutions.

Figure 4:
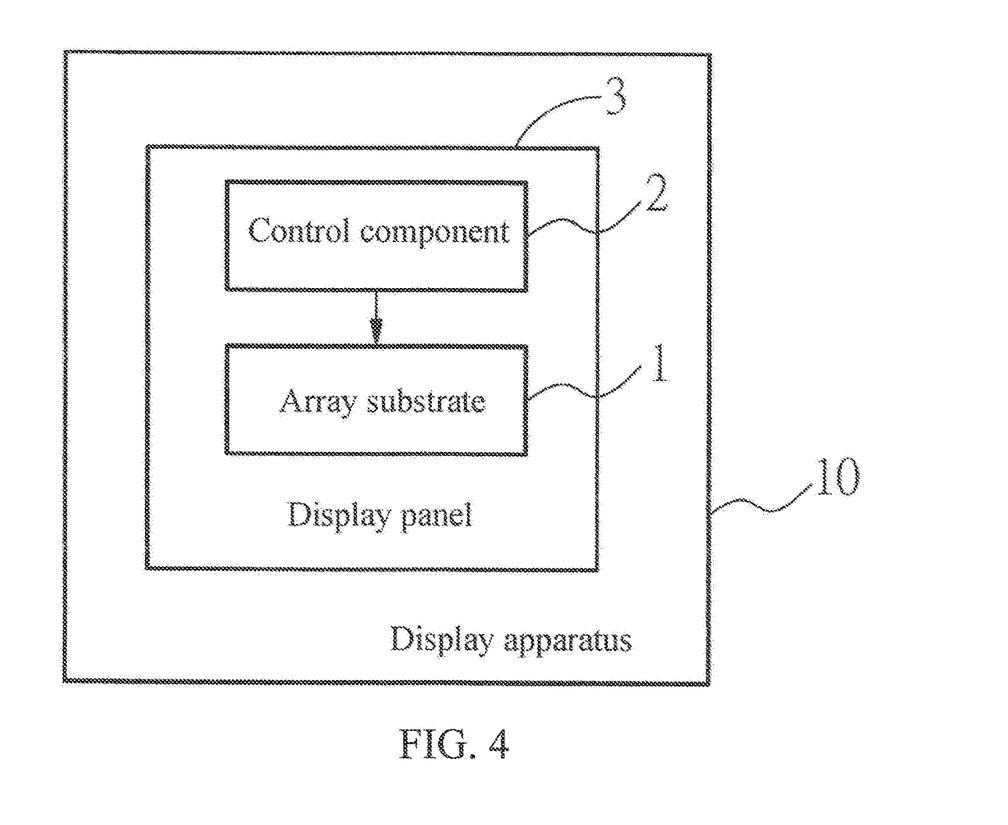
FIG. 4 is a block diagram of a display apparatus according to an embodiment of this application.

FIG. 4 is a block diagram of a display apparatus according to an embodiment of this application. Further, referring to FIG. 2A and FIG. 4, in an embodiment of this application, a display apparatus 10 includes a control component 2 and a display panel 3 including any foregoing array substrate 1.

In an embodiment, the control component may be a straight-down type backlight module or a side-light type backlight module. However, in some embodiments, this application may be applied to an OLED display panel, a W-OLED display panel, a QLED display panel, or a display panel of another type not in need of a backlight module.

In this application, positions of the metal shield layers 16 are staggered up and down and not continuous by changing arrangement of the first common electrode lines 151A, 151B, . . . and the data lines 13A, 13B, . . . . In this way, the first light shield area 171 and the second light shield area 172 are interlaced, reducing a probability of generation of mura.

The wordings such as "in some embodiments" and "in various embodiments" are repeatedly used. The wordings usually refer to different embodiments, but they may also refer to a same embodiment. The words, such as "comprise", "have", and "include", are synonyms, unless other meanings are indicated in the context thereof.

The foregoing descriptions are merely embodiments of this application, and are not intended to limit this application in any form. Although this application has been disclosed above through the specific embodiments, the embodiments are not intended to limit this application. Any person skilled in the art can make some variations or modifications, which arc equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. An array substrate, comprising:
   a substrate;
   wherein a plurality of active switches is disposed on the substrate;
   a plurality of scanning lines extending in a first direction and arranged in parallel in a second direction on the substrate;
   a plurality of data lines arranged in parallel in the first direction on the substrate;
   a plurality of pixel cells, wherein each pixel cell is defined by crossing of two neighboring scanning lines and two neighboring data lines, and each pixel cell comprises two sub-pixels;
   a mesh common electrode line, comprising a plurality of first common electrode lines respectively in parallel with some or all of the plurality of data lines and a plurality of second common electrode lines respectively in parallel with the plurality of scanning lines; and
   a plurality of metal shield layers, extending in the second direction and is disposed between the data line and the sub-pixel, wherein
   the plurality of data lines extend along a first broken-line route in the first direction and the second direction and comprises at least one step-shape appearance, and the plurality of first common electrode lines and the plurality of data lines are interlaced on the substrate in the first direction and along a first broken-line route the same as the first broken-line route or a second broken-line route that is the reverse of the first broken-line route.

2. The array substrate according to claim 1, wherein the second common electrode line is disposed between neighboring scanning lines.

3. The array substrate according to claim 1, wherein the first direction is a horizontal direction, and the second direction is a vertical direction.

4. The array substrate according to claim 1, further comprising a light shield layer covering areas among all sub-pixels.

5. The array substrate according to claim 4, wherein the light shield layer is a black matrix.

6. The array substrate according to claim 4, wherein the light shield layer covers the scanning line, the data line, and the first common electrode line.

7. The array substrate according to claim 4, wherein the light shield layer comprises a plurality of first and second light shield areas, wherein the first light shield area is above the data line and the metal shield layer in the second direction, and the second light shield area is above the first common electrode line in the second direction.

8. The array substrate according to claim 7, wherein a width of the first light shield area is greater than a width of the second light shield area.

9. The array substrate according to claim 8, wherein the first light shield area and the second light shield area are interlaced.

10. An array substrate, comprising:
    a substrate, wherein a plurality of active switches is disposed on the substrate;
    a plurality of scanning lines extending in a first direction and arranged in parallel in a second direction on the substrate;
    a plurality of data lines arranged in parallel in the first direction on the substrate;
    a plurality of pixel cells, wherein each pixel cell is defined by crossing of two neighboring scanning lines and two neighboring data lines, and each pixel cell comprises two sub-pixels;
    a mesh common electrode line, wherein the mesh common electrode line comprises a plurality of first common electrode lines respectively in parallel with some or all of the plurality of data lines and a plurality of second common electrode lines respectively in parallel with the plurality of scanning lines, wherein the second common electrode lines is disposed between neighboring scanning lines; and
    a plurality of metal shield layers, extending in the second direction and is disposed between the data line and the sub-pixel, and
    a light shield layer covering the scanning line, the data line, and the first common electrode line and comprising a plurality of first and second light shield areas, wherein the first light shield area is above the data line and the metal shield layer in the second direction, and the second light shield area is above the first common electrode line in the second direction, and a width of the first light shield area is greater than a width of the second light shield area, and the light shield layer is a black matrix, wherein
    the plurality of data lines extends along a first broken-line route in the first direction and the second direction and comprises at least one step-shape appearance, and the plurality of first common electrode lines and the plurality of data lines are interlaced on the substrate in the first direction and along a first broken-line route the same as the first broken-line route or a second broken-line route that is the reverse of the first broken-line route.

11. A display apparatus, comprising:
    a control component; and
    a display panel, wherein the display panel comprises:
    a substrate, wherein a plurality of active switches is disposed on the substrate;
    a plurality of scanning lines extending in a first direction and arranged in parallel in a second direction on the substrate:
    a plurality of data lines arranged in parallel in the first direction on the substrate;
    a plurality of pixel cells, wherein each pixel cell is defined by crossing of two neighboring scanning lines and two neighboring data lines, and each pixel cell comprises two sub-pixels;
    a mesh common electrode line, wherein the mesh common electrode line comprises a plurality of first common electrode lines respectively in parallel with some or all of the plurality of data lines and a plurality of second common electrode lines respectively in parallel with the plurality of scanning lines; and a plurality of metal shield layers, extending in the second direction and is disposed between the data line and the sub-pixel, wherein the plurality of data lines extends along a first broken-line route in the first direction and the second direction and comprises at least one step-shape appearance, and the plurality of first common electrode lines and the plurality of data lines are interlaced on the substrate in the first direction and along a first broken-line route the same as the first broken-line route or a second broken-line route that is the reverse of the first broken-line route.

12. The display apparatus according to claim 11, wherein the second common electrode line is disposed between neighboring scanning lines.

13. The display apparatus according to claim 11, wherein the control component is a backlight module.

14. The display apparatus according to claim 13, wherein the control component is a straight-down type backlight module or a side-light type backlight module.

15. The display apparatus according to claim 11, further comprising a light shield layer covering areas among all sub-pixels.

16. The display apparatus according to claim 15, wherein the light shield layer is a black matrix.

17. The display apparatus according to claim 15, wherein the light shield layer covers the scanning line, the data line, and the first common electrode line.

18. The display apparatus according to claim 15, wherein the light shield layer comprises a plurality of first and second light shield areas, wherein the first light shield area is above the data line and the metal shield layer in the second direction, and the second light shield area is above the first common electrode line in the second direction.

19. The display apparatus according to claim 18, wherein a width of the first light shield area is greater than a width of the second light shield area.

20. The display apparatus according to claim 18, wherein the first light shield area and the second light shield area are interlaced.

* * * * *